(12) United States Patent
Wakabayashi

(10) Patent No.: US 6,292,011 B1
(45) Date of Patent: *Sep. 18, 2001

(54) METHOD FOR MEASURING COLLECTOR AND EMITTER BREAKDOWN VOLTAGE OF BIPOLAR TRANSISTOR

(75) Inventor: Masaru Wakabayashi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/353,765

(22) Filed: Jul. 15, 1999

(30) Foreign Application Priority Data

Jul. 16, 1998 (JP) .................................. 10-201506

(51) Int. Cl.$^7$ ..................................................... G01R 31/26
(52) U.S. Cl. ............................................................. 324/768
(58) Field of Search ..................... 324/768, 765, 324/763, 759, 713

(56) References Cited

U.S. PATENT DOCUMENTS 5,600,578 * 2/1997 Fang et al. ............................ 324/768

FOREIGN PATENT DOCUMENTS 62-86757 4/1987 (JP) .
8-146079 6/1996 (JP) .

* cited by examiner

Primary Examiner—Safet Metjahic
Assistant Examiner—J Kerveros
(74) Attorney, Agent, or Firm—McGinn & Gibb, PLLC

(57) ABSTRACT

A collector current and a ratio of current amplification which are to measure a punch through breakdown voltage (BVCEO) of a vertical bipolar transistor device are indicated as IC and hFE. A base current IB having 1% of IC/hFE or less is caused to flow to a base of the device. In the state in which the base current IB is injected into a base terminal, a constant voltage (VE) of a ground potential is applied to an emitter terminal and a voltage sweep is performed with a predetermined step width over a collector terminal. When the collector current reaches the current IC to measure the punch through breakdown voltage, the voltage sweep is stopped to measure the punch through breakdown voltage as a collector voltage VC. Consequently, a collector and emitter punch through breakdown voltage of the bipolar device can be accurately measured, and furthermore, the device can be prevented from breaking down when measuring the punch through breakdown voltage.

12 Claims, 5 Drawing Sheets

METHOD FOR MEASURING COLLECTOR AND EMITTER BREAKDOWN VOLTAGE OF BIPOLAR TRANSISTOR

BACKGROUND OF THE INVENTION

1. Field of the Invention

The present invention relates to a breakdown voltage characteristic of a vertical bipolar device, and more particularly to a method for measuring a collector and emitter breakdown voltage of a bipolar transistor which can measure a punch through breakdown voltage characteristic between a collector and an emitter with high accuracy.

2. Prior Art

In a vertical bipolar device, a manufacturing margin for the depth of each junction of a collector, a base and an emitter has been strictly restricted with an increase in fineness and performance of the device, and it is one of important factors that a breakdown voltage characteristic between electrodes, particularly, a punch through breakdown voltage characteristic between the collector and the emitter should be accurately defined ("Very High Digital Device Series 1, Very High Bipolar Device", Chapter 2, section 3–5 (pages 56 to 60) by Baifukan, the first edition was issued on Nov. 15, 1985).

For this reason, usually, a method is employed in which a collector and an emitter are connected to a measuring terminal and a base is disconnected from the measuring terminal, a voltage source is connected to a collector connecting terminal and an emitter connecting terminal is connected to a ground, thereby applying a voltage between the collector and the emitter.

In this method, however, the voltage is applied between the collector and the emitter so that a reverse bias is greatly applied to a collector and base junction and a depletion layer extends onto the collector side. On the other hand, holes of some electron—hole pairs generated in the collector junction enter a base region. However, since the base is in a disconnected (open) state, a base current does not flow and a voltage drop is not caused. Therefore, the same electric potential as in the collector and base junction is applied to An emitter and base junction. Accordingly, even if the collector and base junction takes a voltage (collector and base breakdown voltage) for causing avalanche breakdown, punch through is not caused and the depletion layer does not reach the emitter and base junction. Therefore, the emitter and base junction breaks down as soon as the avalanche breakdown is caused. For this reason, it is apparent that the above-mentioned prior art has not taken sufficient countermeasures to cause no destroy of the device and to accurately perform measurement.

For example, Japanese Patent Application Laid-Open NO. Sho-62-86757 has disclosed a technique in which a resistive element and a diode element are connected in series between a base and an emitter of a device and a polarity thereof is reverse to that of a base and emitter junction, thereby extracting measuring terminals from both poles of the diode element.

In this technique, when a voltage in applied between the collector and the emitter, a voltage is applied to the diode in a reverse direction. Therefore, the base and emitter is set in an electric potential state which is nearly a disconnected (open) state. However, a reverse junction leakage current of the diode flows into a base region through a resistor between the base and the emitter so that a depletion layer can reach the emitter and base junction. For this reason, the prior art has a sort of effects of accurately measuring a punch through breakdown voltage between the collector and the emitter.

According to the technique described in the Japanese Patent Application Laid-Open NO. Sho-62-86757, however, when a backward voltage is applied between the emitter and the base, the diode element is set forward. Therefore, an emitter and base breakdown voltage (zener breakdown) cannot be accurately defined. Therefore, there has been another problem in that characteristics other than the punch through breakdown voltage cannot be defined in respect of the reliability and integration degree of the device characteristics. Furthermore, the prior art has a problem in that a device area cannot be reduced because the diode element is provided in addition to the bipolar element.

In consideration of adaptation to an increase in the fineness and performance of the device, moreover, the following problem arises. More specifically, a diffusion layer becomes shallow and the impurity concentrations of the base and the emitter are $10 \times 10^{18}$ cm$^{-3}$ or more and a Zener breakdown is caused in place of the conventional avalanche breakdown. Therefore, the reverse junction leakage current of the diode is increased so that the function of the diode cannot be performed.

On the other hand, Japanese Patent Application Laid-Open NO. Hei-8-146079 has disclosed a method for measuring a collector and emitter breakdown voltage of a bipolar transistor which is intended to avoid the influence of a snap back characteristic and to obtain the accurate measured value of a breakdown voltage without causing the destroy of a measuring element. In this method, a breakdown voltage BVCEO of an NPN bipolar transistor is measured by the following method. First of all, an emitter terminal is grounded. Next, a probe current of 100 $\mu$A is caused to flow to a base terminal. Then, a decision current of 100 $\mu$A is caused to flow to a collector terminal. The decision current should measure a punch through breakdown voltage BVCEO. A voltage at which the decision current flows is set to a breakdown voltage. Subsequently, a 0 current is caused to flow to the base terminal. The 0 current means that the base terminal is opened as described in an embodiment of the prior art official gazette (see paragraph 0019 and FIG. 1(b) of the official gazette). Consequently, although the decision current continuously flows, a base current approximates 0 and a voltage is raised. A voltage between the collector and emitter terminals is measured as BVCEO. In the prior art, thus, a bipolar operation is performed to cause the base current to flow, and the base current is then set to 0, thereby avoiding a negative resistive region to measure a breakdown voltage.

However, each junction area is decreased and a depth is reduced with the fineness of the device and a reduction in the size thereof in recent years. Under such circumstances, a constant current of 100 $\mu$A is first caused to flow to a base in the prior art described in the Japanese Patent Application Laid-Open NO. Hei-8-146079. In this case, when the current of 100 $\mu$A is instantaneously caused to flow, there is a particular possibility that the base and emitter junction might destroy. Therefore, it should take plenty of time to increase a current sequentially from 0 A. Furthermore, it is necessary to wait for the next operation until a current value is stabilized. For this reason, the above-mentioned prior art has had a problem in that a measuring time is increased and a throughput is deteriorated.

SUMMARY OF THE INVENTION

It is an object of the present invention to provide a method for measuring a collector and emitter breakdown voltage of a bipolar transistor which can accurately measure a punch through breakdown voltage between the collector and emitter of a bipolar device, can prevent the destroy of the device when measuring the punch through breakdown voltage and can prevent characteristics from being deteriorated.

The present invention provides a method for measuring collector and emitter breakdown voltage of a vertical bipolar transistor device. A collector current and a ratio of current amplification which are to measure a punch through breakdown voltage (BVCEO) of the bipolar transistor is indicated as IC and hFE, respectively. A base current IB having 1% of IC/hFE or less is caused to flow to a base of the device, and the collector and emitter punch through breakdown voltage is measured with the base current IB injected into a base terminal.

In the method for measuring a collector and emitter breakdown voltage of a bipolar transistor, a constant voltage (VE) of a ground potential is applied to an emitter terminal, the base current IB is injected into the base terminal, a voltage sweep is then performed with a predetermined step width over a collector terminal, and the voltage sweep is stopped when the collector current reaches the current IC to measure the punch through breakdown voltage and a collector voltage VC obtained at that time is set to the punch through breakdown voltage, or a constant voltage (VE) of a ground potential is applied to an emitter terminal, the base current IB is injected into the base terminal, a current sweep is then performed with a predetermined step width over a collector terminal, and the current sweep is stopped when the collector current reaches the current IC to measure the punch through breakdown voltage and a collector voltage VC obtained at that time is set to the punch through breakdown voltage.

For example, the current IC to measure the punch through breakdown voltage is equal to or greater than a current flowing in the first stage of a punch through and is equal to or smaller than an actual upper limit current, and the base current is enough to prevent generation of snap back and is such a microcurrent as not to influence measurement of the BVCEO.

Preferably, after the base current IB is injected, start of the voltage sweep or the current sweep of the collector terminal is waited until the state is stabilized.

In the voltage sweep, the collector voltage VC can be increased with a step width of 0.01 V to 1 V from a voltage equal to or lower than a standard lower limit value of the BVCEO. In the current sweep, the collector current can be increased with a stop width of 1 $\mu$A to 10 $\mu$A.

According to the present invention, the punch through breakdown voltage between the collector and the emitter is measured while injecting a microcurrent into the base terminal of the vertical bipolar device. Therefore, a punch through state can be easily realized and an accurate breakdown voltage can be measured. Furthermore, if the breakdown voltage is measured by a voltage sweep or current sweep for gradually increasing a voltage or current for the collector, the emitter and base junction is not destroyed.

BRIEF DESCRIPTION OF TEE DRAWINGS

BRIEF DESCRIPTION OF THE PREFERRED EMBODIMENTS

Figure 1:
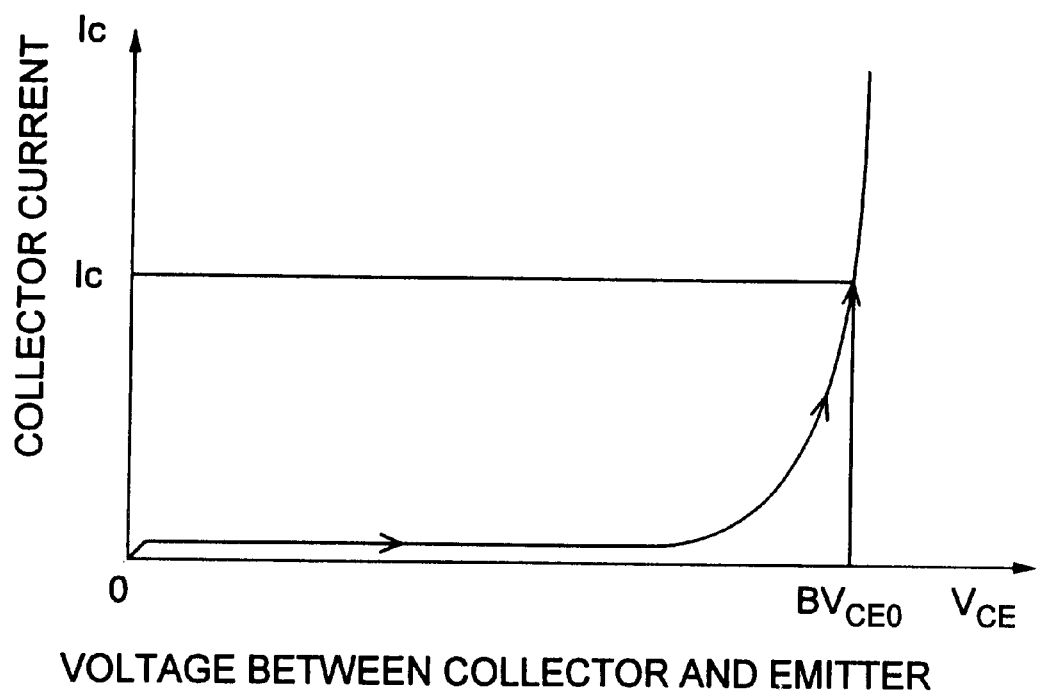
FIG. 1 is a graph showing the relationship between a collector and emitter voltage VCE and a collector current IC according to an embodiment of the present invention.

An embodiment of the present invention will be specifically described below with reference to the accompanying drawings. FIG. 1 is a graph showing the relationship between a collector and emitter voltage VCE and collector current IC according to a method of the embodiment of the present invention, FIG. 2A is a diagram showing the connecting state of each terminal of a vertical bipolar transistor and a measuring unit (SMU), FIG. 2B is a circuit diagram showing the structure of the measuring unit, FIG. 3 is a typical view showing a measuring method, and FIG. 4 is a sectional view showing the structure of a vertical NPN bipolar transistor which is a measuring object.

As shown in FIG. 2A, measuring units (SMU) 2, 3 and 4 acting as measuring equipment are connected to a collector (C), a base (B) and an emitter (E) of a device 1 whose characteristic is to be measured, respectively. As shown in FIG. 2B, the measuring units 2 to 4 have a switch 6 for switching the connection of a current source 7 or a voltage source 8 to each of terminals and an SMU control circuit 5 for controlling this switching operation which are built therein. The voltage of the current source 7 is monitored and the current of the voltage source 8 is monitored. In the measuring units 2 to 4, the switch 6 can be controlled by the SMU control circuit 5 to select the supply of a voltage or a current to the device 1 and to measure the same.

In the present embodiment, the device 1 has a collector connecting terminal to which the voltage source 8 a is connected through the measuring unit 2, a base connecting terminal to which the current source 7 is connected through the measuring unit 3, and an emitter connecting terminal to which a 0V constant voltage source 8 or a ground is connected through the measuring unit 4.

Figure 3:
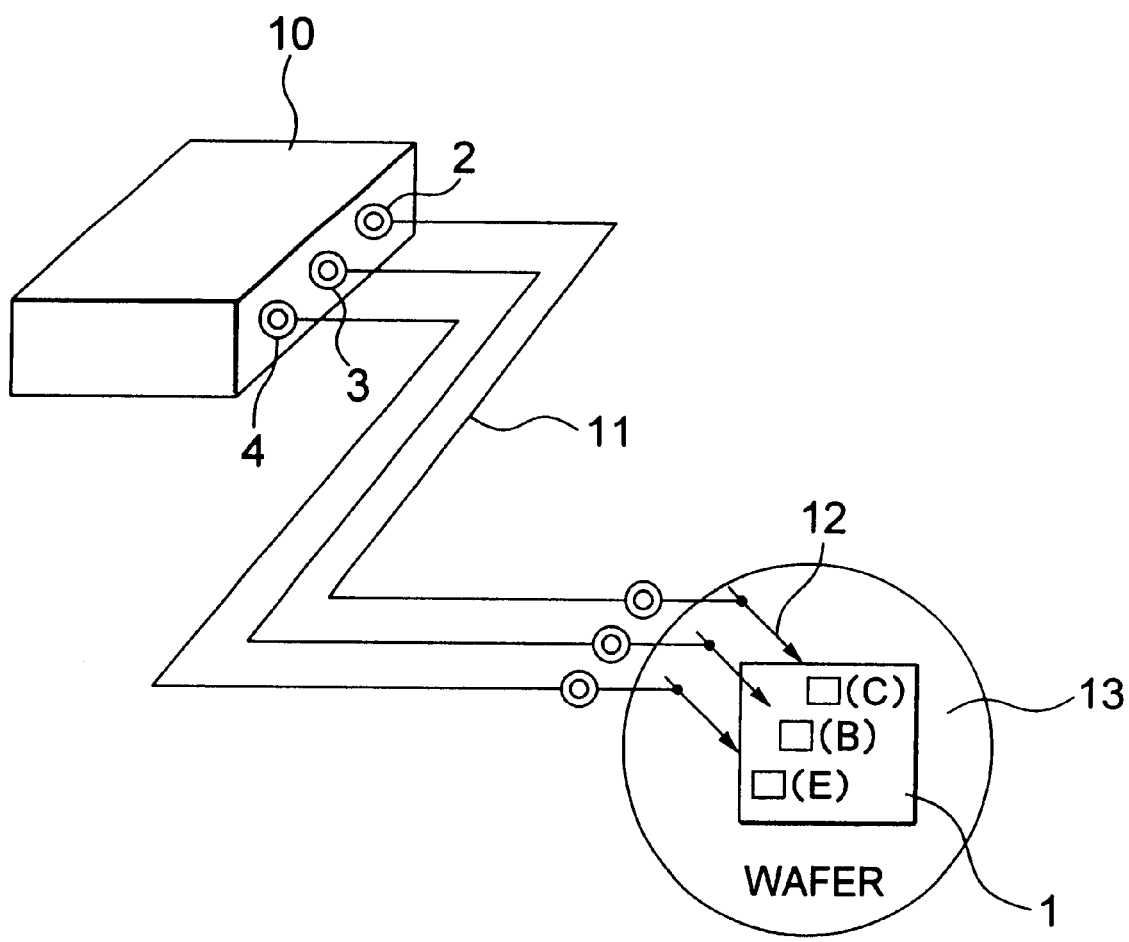
FIG. 3 is a typical view showing a measuring method according to the present embodiment.
Figure 4:
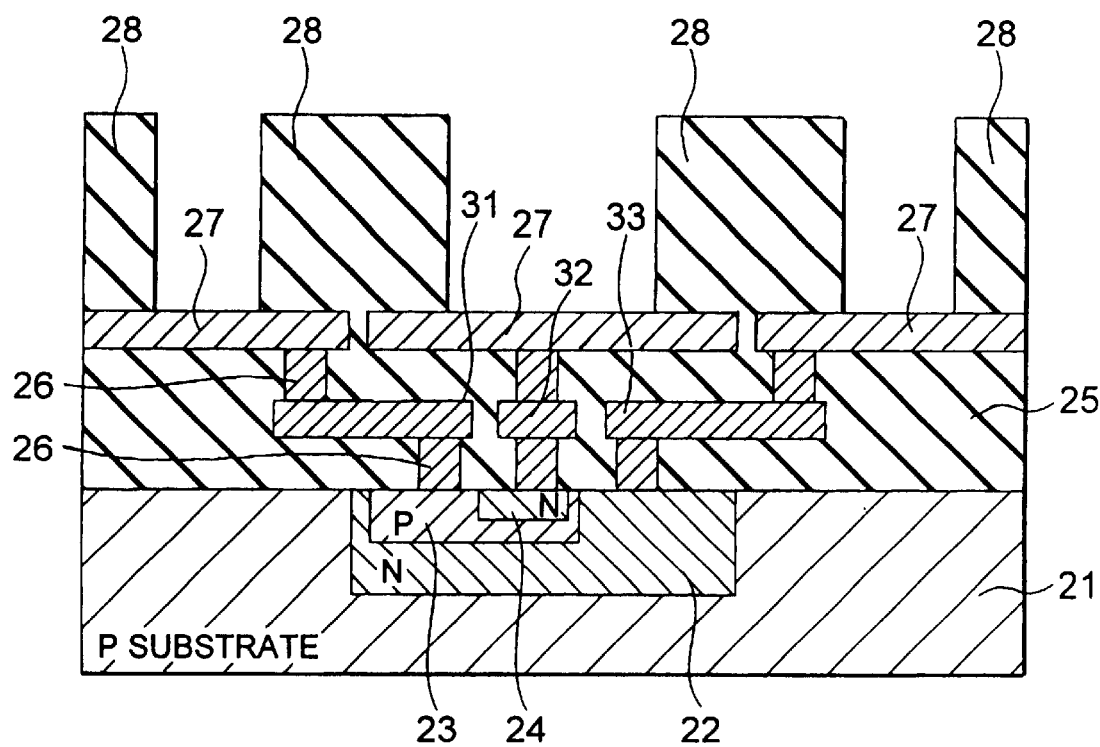
FIG. 4 is a sectional view showing the structure of a vertical RPN bipolar transistor which is a measuring object.

FIG. 3 shows the connecting relationship between a vertical NPN bipolar device 1 fabricated in a wafer 13 and a measuring machines and tools 10. The measuring machines and tools 10 is a semiconductor parameter analyzer or the like, for example. The measuring machines and tools 10 has the measuring units 2 and 3 built therein. The measuring units 2 and 3 have functions of both a voltage-source/current monitor and a current-source/voltage monitor as described above, and can properly select and use them. A coaxial cable 11 is connected to the terminals of the measuring units 2 to 4 (SMU). A probe needle 12 made of tungsten is connected to the other terminal of the coaxial cable 11, for example. The tip of the probe needle 12 can come in contact with each electrode of the device 1 which is formed on the wafer 13.

Next, the structure of the semiconductor device 1 to be measured will be described. FIG. 4 is a sectional view showing the structure of the vertical NPN bipolar device 1 to be measured. In the vertical NPN bipolar device according to the present embodiment, for example, a collector N-type diffusion layer 22, a base P-type diffusion layer 23 and an emitter N-type diffusion layer 24 are formed on the surface of a P-type wafer substrate 21 by impurity diffusion. An interlayer insulation film 25 is formed on the substrate 21. A collector electrode 33, a base electrode 31 and an emitter electrode 32 which are made of a metallic layer such as aluminum are formed in the interlayer insulation film 25. A square pad 27 which has a side length of 50 to 100 µm and is made of metal such as aluminum is formed on the interlayer insulation film 25, and the diffusion layers 22 to 24, the electrodes 33, 31 and 32 and the pad 27 are connected through a contact 26 provided in the interlayer insulation film 25. A cover film 28 is formed to protect the whole device. In a portion on the pad 27, an opening is formed on the cover film 28. The probe needle 12 can be caused to come in contact with the pad 27 through the opening.

The measuring units 2, 3 and 4 are caused to come in contact with the pad 27 connected to the collector, the base and the emitter of the semiconductor device 1 having such a structure respectively, the measuring unit 3 connected to the base connecting terminal is switched into the current source 7, thereby giving, between the base and the emitter, a microcurrent which takes a ratio of current amplification into consideration. The measuring unit 2 connected to the collector is switched into the voltage source, and the measuring unit 4 connected to the emitter is connected to the 0V constant voltage source or the ground. By applying a voltage between the collector and the emitter, a punch through voltage thereof is measured.

In this case, the terminal of the measuring unit 3 connected to the base is set as a current-source/voltage monitor and each of the terminals of the SMUs 2 and 4 connected to the collector and the emitter is set as a voltage-source/current monitor in the measuring machines and tools 10.

FIG. 1 is a graph showing the relationship between a collector and emitter voltage VCR and a corrector current IC in the method according to the present embodiment.

There will be described in detail a method for measuring a collector and emitter punch through breakdown voltage (BVCEO) when a collector current (IC) is 0.1 mA in a vertical NPN bipolar transistor having a ratio of current amplification (hFE) of about 100, for example.

First of all, the terminals of the measuring units (SMU) 2 to 4 of the measuring machines and tools 10, the coaxial cable 11 and the probe needle 12 are connected to each other, and the probe needle 12 is then caused to come in contact with the device pad 27 provided on the wafer 13.

Next, a 0V (ground) constant voltage (VE) is applied to the emitter, and a microcurrent (IB) of about 0.01 µA is injected into the base. IB is set to 1% of IC/hFE or less. After the voltage and the current are applied, the state is kept for about 20 ms until it is stabilized. Consequently, the corrector current IC slightly flows as shown in FIG. 1.

Then, an applied voltage is increased with a step value from 0 V (ground) to 0.01 V or 0.1 V for the collector, thereby performing a voltage sweep (VC). Consequently, the collector and emitter voltage VCE is increased as shown in FIG. 1.

When the collector current (IC) approximates a current of 0.1 mA to measure a punch through breakdown voltage, it is rapidly increased, when the collector current reaches 0.1 mA, the voltage sweep is stopped to store a voltage BVCEO obtained at that time.

The stored voltage value is displayed as the punch through breakdown voltage (BVCEO) on a display unit (not shown).

Thereafter, the voltage application and the current injection to the emitter and the base are stopped and the probe needle 12 is removed from the device pad 27 provided on the wafer. Thus, the measurement is completed.

The current IC to measure the punch through breakdown voltage is equal to or greater than a current flowing in the first stage of the punch through and is equal to or smaller than an actual upper limit current, and is 0.1 mA, for example, as described above. While the base current IB is 0.01 µA in the above-mentioned embodiment, it is not restricted thereto in the present invention. The base current IB may be enough to prevent the generation of snap back that is a phenomenon in which a breakdown voltage is rapidly dropped when a transistor breaks down and a current starts to flow, and may be a microcurrent which does not influence the measurement of the breakdown voltage BVCEO between the collector and the emitter. Furthermore, while the voltage sweep is performed by increasing an applied voltage with a step value from 0 V (ground) to 0.01 V or 0.1 V for the collector in the present embodiment, it is not restricted thereto in the present invention. The voltage sweep (VC) does not always need to be started from 0 V but may be performed with a step width of 0.01 V to 1 V by increasing the collector voltage VC from a voltage which is equal to or lower than a standard lower limit value of the collector and emitter punch through breakdown voltage BVCED, for example.

In the present embodiment, the microcurrent is injected into the base. Therefore, the breakdown of a collector and base junction is not caused by the application of a voltage between the collector and the emitter. Furthermore, the microcurrent is injected into the base. Therefore, a microcurrent which takes the ratio of current amplification into consideration is given between the base and the emitter. Consequently, the punch through state can be easily realized and the collector and emitter punch through breakdown voltage can be accurately measured. In addition, the voltage to be applied to the collector is gradually increased in the present embodiment. Therefore, the emitter and base junction is not destroyed.

In the present embodiment, accordingly, the reliability of a device breakdown voltage characteristic is remarkably enhanced. According to the present embodiment, in addition, the vertical NPN device 1 to be measured does not need the connection of a special device for measuring a breakdown voltage or the like and has the same structure as the structure of a device used in an actual semiconductor device. Therefore, it is possible to measure device characteristics such as each junction breakdown voltage, a ratio of current amplification and the like as well as the punch through breakdown voltage. Accordingly, the reliability of the device characteristics can be enhanced and furthermore, the area of the device to be measured can be reduced and a design can be easily performed.

The collector and base junction breakdown voltage BVCBO can be measured by opening the emitter, setting the base to a ground potential 0 V, applying a voltage to the collector and displaying a voltage when the decision current of the collector is obtained. Furthermore, the emitter and base junction breakdown voltage BVEBO can be measured by opening the collector, setting the base to the ground potential 0 V, applying a voltage to the emitter and displaying a voltage when the decision current of the emitter is obtained. As described above, the result of the device can also be checked by measuring a reverse junction breakdown voltage. On the other hand, a ratio of current amplification hFE can be measured in the following manner. First of all, the emitter is set to a ground potential, the collector is set to a constant voltage (VCE=2 V), and a voltage is applied to the base, thereby measuring a base current (IB) as a collector decision current (IC=100 µA). At this time, if IB=1 µA, for example, a ratio of current amplification hFE=IC/IB=100 is obtained.

A second embodiment of the present invention will be described below. While the voltage sweep is performed for the collector to measure the breakdown voltage in the above-mentioned first embodiment, an accurate measured value can be obtained by a current sweep in the present embodiment.

Also in the present embodiment, there will be described a method for measuring a collector and emitter punch through breakdown voltage (BVCEO) with a collector current (IC) of 0.1 mA for a vertical NPN bipolar transistor having a ratio of current amplification (hFE) of about 100 in the same manner as in the first embodiment.

First of all, the terminals of the measuring units 2 to 4, the coaxial cable 11 and the probe needle 12 are connected to each other, and the probe needle 12 is then caused to come in contact with the pad 27 of the device 1 provided on the wafer.

Figure 2:
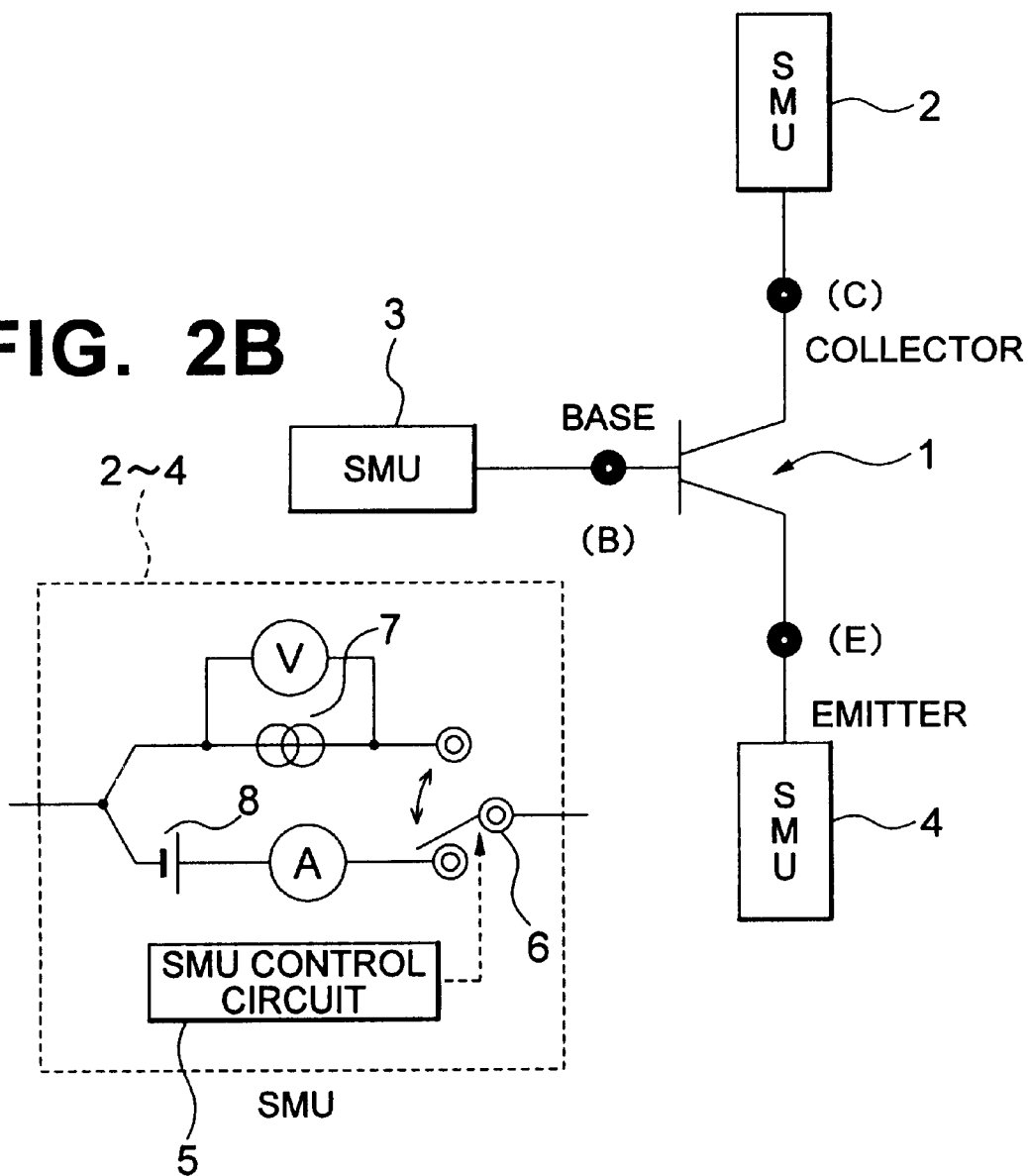
FIG. 2A is a diagram showing the connecting state of each terminal of a vertical bipolar transistor and a measuring unit (SMU)
FIG. 2B is a circuit diagram showing the structure of the measuring unit.

Then, each of measuring units 3 and 2 to be connected to each of a base (E) and a collector (C) of a semiconductor device 1 is met as a current-source/voltage monitor by switching a switch 6 shown in FIG. 2 to the current source 7 side, and a measuring unit 4 to be connected to an emitter (E) is set as a voltage-source/current monitor by switching the switch 6 to a voltage source 8.

Subsequently, a constant voltage (VE) of 0 V (ground) is applied to the emitter, and a microcurrent (IB) of about 0.01 $\mu$A is injected into the base. Also in this case, the base current IB is set to 1% of IC/hFE or less. After a voltage and a current are applied, the state is kept for about 20 ms until it is stabilized.

Next, a current sweep (IC) is performed with a step value of 0 $\mu$A (0 A of a 1 $\mu$A range) to 1 $\mu$or 10 $\mu$A for the collector. More specifically, when a current is increased with a step of 0 $\mu$A to 1 $\mu$A or 10 $\mu$A, a collector voltage (VC) is generated on the collector. As the collector current is increased, a collector and emitter voltage vCR is increased as shown in FIG. 1.

Then, when the collector current (IC) becomes 0.1 mA (100 $\mu$A), the current sweep is stopped. At that time, a voltage value VCE of the collector is stored. The stored voltage value is displayed as a punch through breakdown voltage (BVCEO).

Thereafter, the voltage application and the current injection to the emitter and the base are stopped and the probing needle is removed from the device pad provided on the wafer. Thus, the measurement is completed.

While the current sweep has been performed with a step value from 0 $\mu$A to 1 $\mu$A or 10 $\mu$A for the collector in the above-mentioned embodiment, the present invention is not restricted thereto but the current sweep may be performed by increasing the collector current with a step width of 1 $\mu$A to 100 $\mu$A.

Also in the present embodiment, the microcurrent is injected into the base. Therefore, a punch through state can be easily obtained and an accurate breakdown voltage can be measured. Furthermore, since the current is gradually increased for the collector, an emitter and base junction is not destroyed.

In addition, while the breakdown voltage value obtained from the measurement by the voltage sweep to the collector has the same digit as the step value in the first embodiment, the breakdown voltage value obtained from the measurement by the current sweep to the collector can be displayed with a digit up to a resolution (about 1 mV) of the SMU of the measuring machines and tools in the present embodiment. Accordingly, it is possible to obtain the effect of measuring a more accurate breakdown voltage value.

In each of the above-mentioned embodiments, the vertical NPN device to be measured is formed on the wafer. Referring to a semiconductor device assembled in a package and having a structure in which each of a base, an emitter and a collector is connected to a package pin through a bonding wire or the like, a breakdown voltage can be measured by the present invention in the same manner.

Furthermore, in a vertical PNP bipolar device as well as the vertical NPN bipolar device which is to be measured, a breakdown voltage can be measured by changing the polarity in the measuring conditions.

In the vertical PNP formed on a P-type wafer, furthermore, it is possible to accurately measure the breakdown voltage of a parasitic PNP having a P-type collector layer as an emitter, an N-type buried layer as a base and a P-type substrate as a collector.

Figure 5:
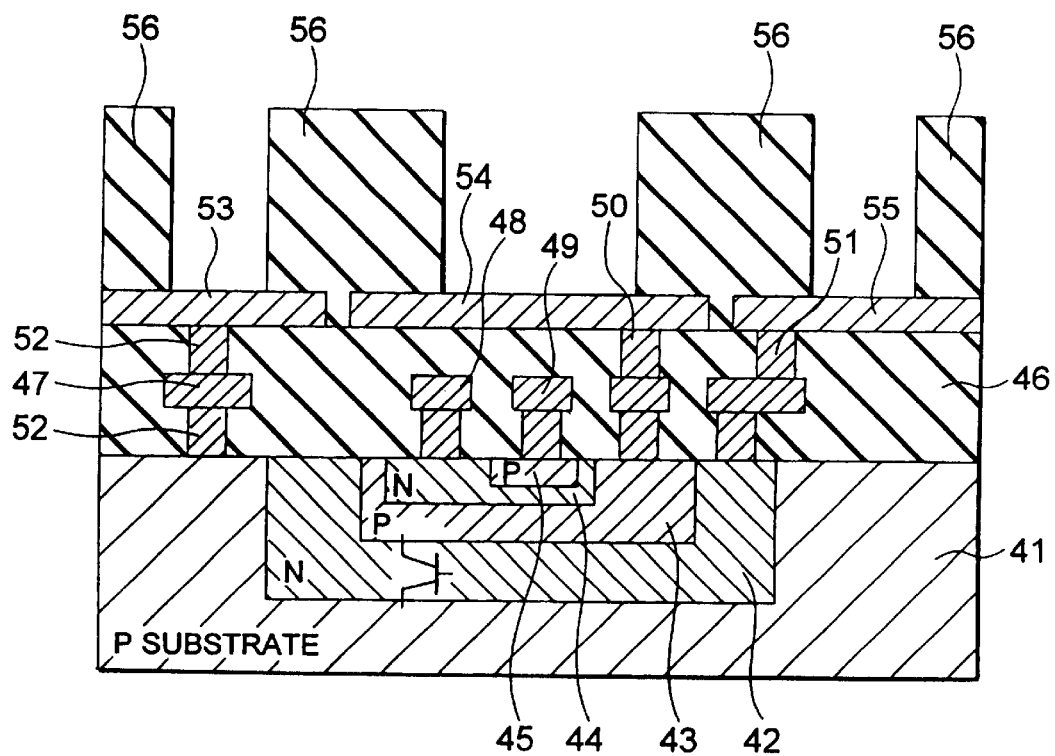
FIG. 5 is a sectional view showing a parasitic PNP bipolar transistor.

As shown in FIG. 5, an buried N-type diffusion layer 42 is formed on the surface of a P-type wafer substrate 41, and a collector P-type diffusion layer 43 is formed on the surface of the buried N-type diffusion layer 42. A base N-type diffusion layer 44 is formed on the surface of the P-type diffusion layer 43, and an emitter P-type diffusion layer 45 is formed on the surface of the base N-type diffusion layer 44. Electrodes 47, 48, 49, 50 and 51 are formed in a wiring interlayer insulation film 46 formed on the substrate 41, and each of them is connected to each diffusion layer formed on the surface of the substrate through a contact 52 provided on the interlayer insulation film 46. Pads 53, 54 and 55 are formed on the interlayer insulation film 46, and each of them is also connected to each electrode through the contact 52. Furthermore, the whole device is coated with a cover film 56. A portion of the cover film 56 provided above the pad is removed so that the probe needle 12 can be caused to come in contact with the pad.

In the semiconductor device having such a structure, the vertical NPN bipolar transistor and the vertical PNP bipolar transistor are provided together. In a vertical PNP bipolar transistor formed with a multiwell structure, a parasitic PNP bipolar transistor having a P-type collector diffusion layer 43 as an emitter, an N-type buried diffusion layer 42 as a base and a P-type substrate 41 as a collector is formed at the same time.

According to the present invention, the breakdown voltage of the parasitic PNP can also be measured accurately In the case where the PNP bipolar transistor is to be formed on the P-type substrate, an N-type well is formed for insulation of a P-type collector from the P-type substrate. Since the N-type well has a great depth and a low concentration, an isolation voltage should be checked. For this reason, although it is necessary to accurately measure the breakdown voltage of the parasitic PNP, it is very significant that the parasitic PNP can be measured by the present invention in consideration of the fact that manual measurement has been conventionally carried out.

As described above, according to the present invention, a voltage and a current are applied between the collection and the emitter with a microcurrent flowing to the base of the bipolar transistor device to be measured. Therefore, the punch through breakdown voltage can be measured with high accuracy without causing the destruction of the emitters and base junction. According to the present invention, therefore, the reliability of the device breakdown voltage characteristic can be remarkably enhanced and there is no possibility that the device characteristics might be deteriorated during measurement.

In this case, the emitter and base junction is not destroyed by gradually increasing the voltage or the current to be applied to the collector, thereby measuring the breakdown voltage.

Furthermore, it is not necessary to connect a special device for measuring the breakdown voltage or the like to the vertical NPN device to be measured, and is provided with elements having the same structures as those used in an actual semiconductor device. Therefore, it is possible to measure device characteristics such as each junction breakdown voltage and a ratio of current amplification as well as the punch through breakdown voltage. Accordingly, it is possible not only to enhance the reliability of the device characteristics but also to reduce the area of the device to be measured and to easily perform a design.

What is claimed is:

1. A method for measuring a collector and emitter breakdown voltage of a vertical bipolar transistor device, comprising:

preselecting a target collector current value $IC_0$;

flowing a microcurrent base current $IB_0$ having a value 1% of $IC_0$/hFE or less to a base of the device, where hFE is a current amplification ratio of said device;

increasing a collector/emitter voltage VCE, thereby causing collector current IC to increase, until said target collector current value $IC_0$ is reached; and defining a punch through breakdown voltage (BVCEO) as the measured value of said increased collector/emitter voltage VCE causing said collector current IC to increase to reach said value $IC_0$.

2. The method for measuring a collector and emitter breakdown voltage of a bipolar transistor according to claim 1, comprising:

applying a constant voltage (VE) of a ground potential to an emitter terminal;

performing a voltage sweep with a predetermined step width aver a collector terminal; and stopping the voltage sweep when the collector current reaches the preselected current value $IC_0$ to measure the punch through breakdown voltage and setting, to the punch through breakdown voltage, a collector voltage VC obtained at that time.

3. The method for measuring a collector and emitter breakdown voltage of a bipolar transistor according to claim 1, comprising:

applying a constant voltage (VE) of a ground potential to an emitter terminal;

injecting said value for the base current IB into the base terminal;

performing a current sweep with a predetermined step width over a collector terminal; and stopping the current sweep when the collector current reaches the preselected current value $IC_0$ to measure the punch through breakdown voltage and setting, to the punch through breakdown voltage, a collector voltage VC obtained at that time.

4. The method for measuring a collector and emitter breakdown voltage of a bipolar transistor according to claim 2, wherein the preselected current value $IC_0$ to measure the punch through breakdown voltage is equal to or greater than a current flowing in the first stage of a punch through and is equal to or smaller than an actual upper limit current, and the base current is enough to prevent generation of snap back and is such a microcurrent as not to influence measurement of the BVCEO.

5. The method for measuring a collector and emitter breakdown voltage of a bipolar transistor according to claim 3, wherein the preselected current value $IC_0$ to measure the punch through breakdown voltage is equal to or greater than a current flowing in the first stage of a punch through and is equal to or smaller than an actual upper limit current, and the base current is enough to prevent generation of snap back and is such a microcurrent as not to influence measurement of the BVCEO.

6. The method for measuring a collector and emitter breakdown voltage of a bipolar transistor according to claim 2, wherein after the base current $IB_0$ is injected, start of the voltage sweep of the collector terminal is waited until the state is stabilized.

7. The method for measuring a collector and emitter breakdown voltage of a bipolar transistor according to claim 3, wherein after the base current $IB_0$ is injected, start of the current sweep of the collector terminal is waited until the state is stabilized.

8. The method for measuring a collector and emitter breakdown voltage of a bipolar transistor according to claim 2, wherein the voltage sweep increases the collector voltage VC with a step width of 0.01 V to 1 V from a voltage equal to or lower than a standard lower limit value of the BVCEO.

9. The method for measuring a collector and emitter breakdown voltage of a bipolar transistor according to claim 3, wherein the current sweep increases the collector current with a step width of 1 $\mu$A to 10 $\mu$A.

10. A method for measuring a collector and emitter breakdown voltage of a transistor device having a current amplification ratio hFE, comprising:

preselecting a collector current value $IC_0$;

flowing a microcurrent base current IB having a value of $IB_0=(0.01)\times IC_0$/hFE or less to a base of said transistor device;

increasing VCE, thereby causing collector current $IC_0$ to increase, until said $IC_0$ is reached; and defining a punch through breakdown voltage (BVCEO) as the measured value of said increased collector/emitter voltage VCE causing said collector current IC to increase to reach said value $IC_0$.

11. A method for measuring a collector/emitter breakdown voltage of a transistor device having a current amplification ratio hFE, comprising:

preselecting a collector current value $IC_0$;

flowing a microcurrent base current IB having a value of $IB_0=(0.01)\times IC_0$/hFE or less to a base of said transistor, increasing collector current IC until said $IC_0$ is reached;

measuring a value of collector/emitter voltage $V_{CE}$ causing said collector current value $IC_0$ to flow; and defining a punch through breakdown voltage (BVCEO) as the value of VCE causing said value $IC_0$.

12. A method for measuring a collector/emitter breakdown voltage for a transistor having a current amplification factor $\beta$, comprising:

preselecting a first collector current value $IC_0$, said first current value being within a normal operating range of said transistor;

flowing, to a base of said transistor, a microcurrent base current $IB_0$ having a value which is at least one order of magnitude below a value $IC_0/\beta$;

increasing one of either collector current IC or collector/emitter voltage $V_{CE}$ until the collector current measures in the range of said first value $IC_0$, thereby indicating that said collector/emitter breakdown has occurred;

measuring a value of collector/emitter voltage $V_{CE}$ causing said collector/emitter breakdown; and defining a punch through breakdown voltage (BVCEO) as the said measured value.

* * * * *